US006992526B2

(12) United States Patent
Cheng

(10) Patent No.: US 6,992,526 B2
(45) Date of Patent: Jan. 31, 2006

(54) APPARATUS AND METHOD FOR DC OFFSET REDUCTION

(75) Inventor: Jackie Cheng, Irvine, CA (US)

(73) Assignee: Wionics Research, Irvine, CA (US)

( * ) Notice: Subject to any disclaimer, the term of this patent is extended or adjusted under 35 U.S.C. 154(b) by 0 days.

(21) Appl. No.: 10/794,410

(22) Filed: Mar. 5, 2004

(65) Prior Publication Data

US 2005/0195024 A1    Sep. 8, 2005

(51) Int. Cl.
    *H03F 1/02*    (2006.01)
(52) U.S. Cl. ........................... 330/9; 330/259; 327/307
(58) Field of Classification Search ..................... None
    See application file for complete search history.

(56) References Cited

U.S. PATENT DOCUMENTS

| | | | | |
|---|---|---|---|---|
| 5,471,665 A | * | 11/1995 | Pace et al. ................... | 330/259 |
| 6,288,604 B1 | * | 9/2001 | Shih et al. ................... | 330/260 |
| 6,298,226 B1 | | 10/2001 | Lloyd et al. | |
| 6,313,704 B1 | * | 11/2001 | Maruyama et al. ......... | 330/259 |
| 6,441,686 B1 | * | 8/2002 | Nakamura ................... | 330/85 |
| 6,674,328 B2 | * | 1/2004 | Uto et al. ................... | 330/259 |
| 6,831,510 B2 | * | 12/2004 | Jiang .......................... | 330/85 |

* cited by examiner

*Primary Examiner*—Khanh V. Nguyen
(74) *Attorney, Agent, or Firm*—Foley & Lardner LLP

(57) ABSTRACT

A feedback system has a settling time that is independent of the forward gain of the amplifier stage, and a feedback path that is responsive to the magnitude of DC offset in the output signal. Settling time may be made independent of the forward gain of the amplifier stage by providing a constant loop gain in the amplifier stage through active gain control of both the forward and linear feedback amplifier elements. The feedback path may be made responsive to the magnitude of DC offset in the output signal by providing a non-linear transconductance in the feedback path that varies the high pass corner and hence the DC offset reduction time of the amplifier stage in response the magnitude of DC offset in the output signal.

20 Claims, 3 Drawing Sheets

|  | Idle | Preamble | Receive data |
|---|---|---|---|
| Linear feedback amplifier section | On | On | Hold |
| Non-linear feedback amplifier section | On | On | Off |

APPARATUS AND METHOD FOR DC OFFSET REDUCTION

BACKGROUND OF THE INVENTION

1. Field of the Invention

Embodiments of the present invention relate to DC offset reduction techniques and, in particular, to DC offset reduction techniques that provide improved settling time.

2. Description of Related Art

The performance of electronic devices such as cellular telephones, personal digital assistants and other wireless and wired devices is often related directly to the performance of the components making up the devices. For example, the performance of many wireless devices is often related to the device's receiver that receives and processes transmitted signals. A receiver in a wireless device can be critical to the performance of the device. The receiver is often the first component in the device to see a transmitted signal incident on the device's antenna and, thus, is often the first component to influence the signal. Consequently, the quality of the receiver can be critical to the quality of the performance of the device in general.

A direct conversion receiver circuit typically includes a mixer module for down converting a received signal to a baseband signal, a variable gain amplifier for amplifying the baseband signal, and a signal processing module for processing the baseband signal. Many receivers of this type suffer from inherent inefficiencies. For example, many receivers of this type produce a DC offset in the output of the amplifier that degrades the performance of subsequent processing stages and increases power consumption.

FIG. 1 shows the amplifier stage of a receiver circuit disclosed in U.S. Pat. No. 6,290,226. This amplifier stage is designed to compensate for DC offset in the output signal. The amplifier stage is comprised of a variable gain amplifier 10 that receives the input signal of the amplifier stage, an adder 12, a low pass filter 14, and a variable gain amplifier 16 that provides the output signal of the amplifier stage. A feedback path is provided between the output of the fixed gain amplifier 16 and the adder 12. The feedback path is comprised of a first fixed gain feedback amplifier 18, a capacitor 20, and a second fixed gain feedback amplifier 22. The amount of charge stored in the capacitor controls the output of the fixed gain amplifier 22, which supplies a DC signal to the mixer 12 for compensating DC offset in the output signal. The amount of charge stored in the capacitor for compensating a given DC offset is a function of the DC offset and depends on the gains of the various elements in the loop.

While the circuit of FIG. 1 exhibits an improved settling time, the circuit has certain drawbacks. The circuit of FIG. 1 is essentially a high pass filter that passes high frequency components of the input signal and blocks low frequency components of the signal. The rate of DC offset cancellation provided by this circuit depends on the corner frequency of the high pass pole established by the feedback path. The corner frequency depends on the loop gain of the forward amplification elements and the feedback path elements. Because the gain of the feedback path amplifiers 18, 22 is constant while the gain of the variable gain amplifier 16 is not, the corner frequency of the high pass circuit varies with changes in the gain of the variable gain amplifier 16. In particular, the −3 dB high pass corner frequency of the feedback path is lowered when the gain of the variable gain amplifier 16 decreases, making the settling time of the system longer. Thus the settling time varies inversely with the forward gain of the variable gain amplifier 16. This causes undesirable circuit performance.

SUMMARY OF THE INVENTION

Amplifier stages in accordance with a preferred embodiment of the invention improve over the conventional circuit by making the settling time independent of the forward gain of the amplifier stage, and by making the feedback path responsive to the magnitude of DC offset in the output signal.

Settling time may be made independent of the forward gain of the amplifier stage by providing a constant loop gain in the amplifier stage through active gain control of both the forward and linear feedback amplifier elements.

The feedback path may be made responsive to the magnitude of DC offset in the output signal by providing a non-linear transconductance in the feedback path. As a result, the −3 dB high pass corner frequency and hence the DC offset reduction time of the system is responsive to the magnitude of DC offset in the output signal.

DESCRIPTION OF THE DRAWINGS

A detailed description of embodiments of the invention will be made with reference to the accompanying drawings, wherein like numerals designate corresponding parts in the several figures.

DETAILED DESCRIPTION

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the preferred embodiments of the present invention.

Figure 1:
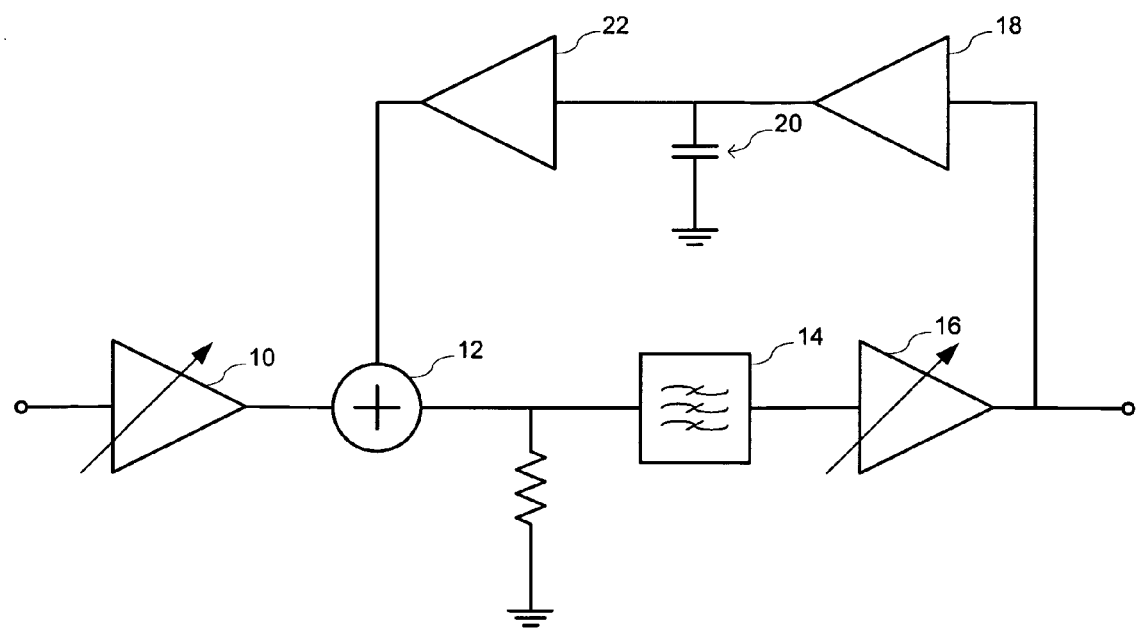
FIG. 1 shows a generalized schematic diagram of the amplifier stage of a conventional receiver device.
Figures 2, 3:
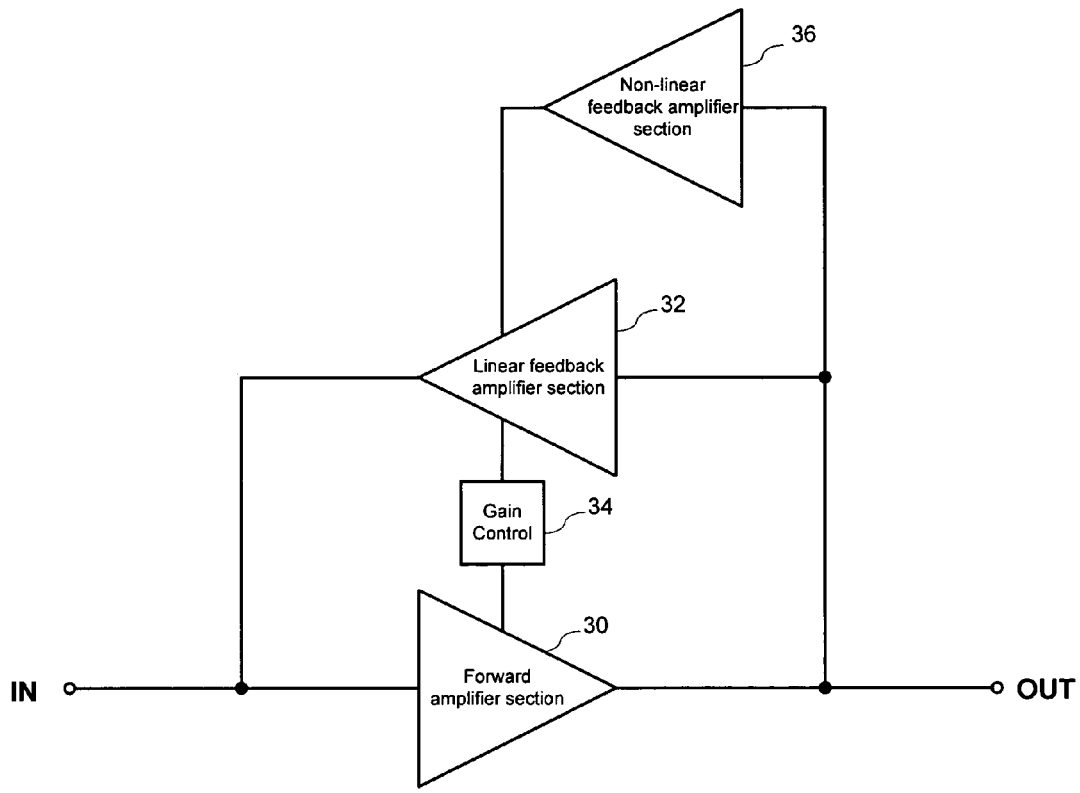
FIG. 2 shows a generalized schematic diagram of a circuit for reducing DC offset according to a preferred embodiment of the present invention.
FIG. 3 shows the status of the feedback path elements of FIG. 2 during different time periods in the operation of a time-slotted receiver circuit in accordance with the preferred embodiment.

FIG. 2 shows a generalized schematic diagram of an amplifier circuit having improved DC offset reduction according to a preferred embodiment of the invention. In this circuit an input signal is received by a forward amplifier section 30. DC offset in the output of the forward amplifier section 30 is corrected by a feedback path that includes a linear feedback amplifier section 32 that senses and compensates for any DC offset in the signal amplified by the forward amplifier section 30. The forward amplifier section 30 and the linear feedback amplifier section 32 are controlled by a common gain control section 34. Gain control is typically utilized in the forward amplifier section of an amplifier stage to provide a relatively constant signal level at the output. In accordance with the preferred embodiment, gain control is provided to the forward amplifier section 30 and to the linear feedback amplifier section 32. When the gain of the forward amplifier section 30 is increased, the gain of the linear feedback amplifier section 32 is decreased proportionally by an amount that maintains the loop gain at a constant level. Similarly, when the gain of the forward amplifier section 30 is decreased, the gain of the linear feedback amplifier section 32 is increased. By maintaining an essentially constant loop gain in this manner, the −3 dB high pass corner frequency of the system becomes independent of the amplifier stage forward gain, thus making the DC offset settling time independent from the gain of the forward amplifier components.

The feedback path of the amplifier stage of the preferred embodiment also includes a non-linear feedback amplifier section 36. During a transient condition, the charging and discharging current that can be provided by the linear feedback amplifier section 32 to a storage capacitor (not shown) in the linear feedback amplifier section is limited by the bias current provided to the linear feedback amplifier section 32. Therefore the amount of offset that can be corrected by the linear feedback amplifier section 32 is limited by the bias current. The use of a non-linear feedback amplifier section 36 in conjunction with the linear feedback amplifier section 32 overcomes this limitation. The amplification provided by the non-linear feedback amplifier increases as a function of the magnitude of the DC offset in the output signal. Essentially, the non-linear feedback amplifier section 36 varies the −3 dB high pass corner frequency in response to the magnitude of DC offset in the output signal so that a higher corner frequency and therefore a more rapid settling time is provided corresponding to the magnitude of the DC offset in the output signal. Thus the settling time is significantly reduced even in the event of large DC transients.

Consequently, amplifier stages in accordance with the preferred embodiment improve over the conventional circuit by making the settling time independent of the forward gain of the amplifier stage, and by making the settling time responsive to the magnitude of DC offset in the output signal.

FIG. 3 shows the status of the linear and non-linear feedback amplifier sections during various phases of data reception in a time-slotted, implementation. During an idle phase 40 when no data is being received, the linear feedback amplifier section is on to cancel any device induced DC offset, and the non-linear feedback amplifier section is also on to set a high corner frequency to provide fast settling time.

During the reception of a preamble phase 42 of a receive timeslot, the linear feedback amplifier section remains on to cancel DC offset. Typically automatic gain control is applied at this time to both the forward amplifier section and the linear feedback amplifier section, causing the loop gain to remain essentially constant. The non-linear feedback amplifier section is also on during the preamble phase 42 of the receive timeslot to increase DC offset correction.

During a receive data phase 44 of the receive timeslot, the linear feedback amplifier section is in hold mode to hold a DC offset compensation charge that was stored during the preamble phase 42. The non-linear feedback amplifier section is turned off at this time to maintain the high pass corner frequency at approximately 30 kHz so that received signals are not corrupted. The linear feedback amplifier section and the non-linear feedback amplifier section are turned on again in the next idle or preamble phase to provide further DC offset cancellation.

Figure 4:
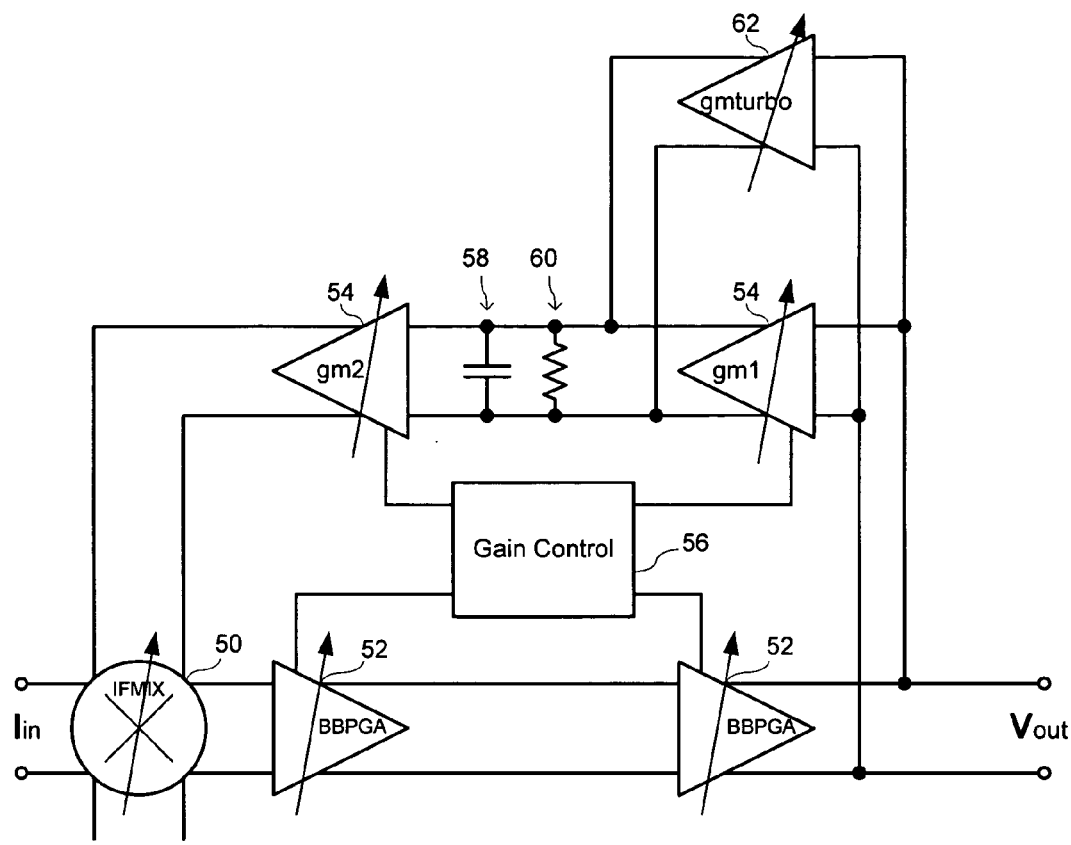
FIG. 4 shows a more detailed schematic diagram of a preferred embodiment of an amplifier stage of a receiver circuit.

FIG. 4 shows a schematic diagram of a circuit in accordance with the preferred embodiment of FIG. 2. The circuit of FIG. 4 is a down conversion circuit that converts a received signal to baseband by mixing with a radio frequency and amplifies the baseband signal. An input signal is received by a mixer 50. The input signal is a differential signal comprised of an input current and a complementary input current. The input currents are passed a through programmable gain amplifiers 52 that provide forward amplification of the baseband signal to generate differential output voltage signals. Feedback for purposes of DC offset cancellation is provided by programmable gain linear feedback amplifiers 54. The gains of the amplifiers 52 of the forward section and the linear amplifiers 54 of the feedback path are controlled by a gain control section 56. The gain control section 56 controls the gain of the forward amplifiers 52 to provide an essentially constant magnitude in the output signal. The gain control section 56 controls the gain of the linear feedback path amplifiers 54 to provide a constant loop gain in light of gain changes in the forward amplifiers 52. Consequently, an increase in the gain of the forward amplifiers 52 is balanced by a corresponding decrease in the gain of the linear feedback amplifiers 54.

The feedback path in the circuit of FIG. 4 also includes a capacitor 58 and a resistor 60 for storage of a charge that is used to provide a feedback signal to the mixer 50 for compensating DC offset in the output signal. The capacitor 58 is charged by the first of the linear feedback path amplifiers 54.

A nonlinear feedback amplifier 62 is provided in parallel with the first linear feedback path amplifier 54. The nonlinear feedback amplifier 62 may be implemented as a class A/B amplifier. The capacitor 58 is also charged by the nonlinear feedback amplifier 62 to decrease the time required to store charge in the capacitor.

Control of the nonlinear feedback amplifier 62 may be implemented in several manners. In the preferred embodiment, the amount of gain of the nonlinear feedback amplifier 62 is controlled within the amplifier 62 itself in response to the amount of DC offset in the output signal of the amplifier stage, which is sensed at the inputs to the nonlinear feedback amplifier 62. In alternative embodiments, the gain of the nonlinear feedback amplifier 62 may be controlled externally, such as by the gain control section 56, in response to DC offset in the output signal. In further alternative embodiments, the gain of the nonlinear feedback amplifier 62 may be set to a high value, and the nonlinear feedback amplifier 62 may be selectively turned on and off to control its effect on the settling time.

Figure 5:
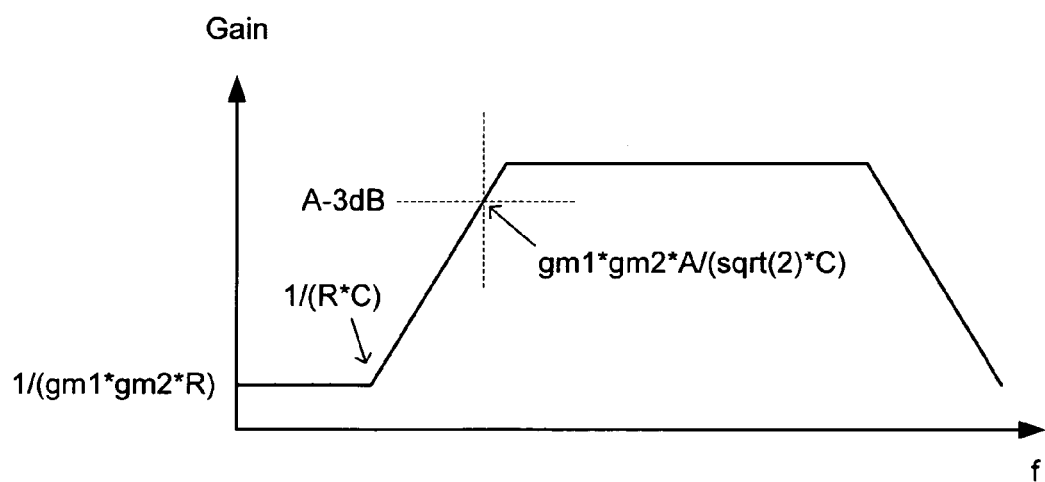
FIG. 5 shows a graph of the transfer function in the frequency domain of the circuit of FIG. 4.

A graph of the transfer function in the frequency domain of the circuit of FIG. 4 is shown in FIG. 5. For a circuit in which the gain of the forward amplifiers 52 is A, the transconductance of the linear feedback amplifiers 54 are $g_{m1}$ and $g_{m2}$, respectively, the value of the resistor is R, and the value of the capacitor is C, the gain $V_{out}/I_{in}$ of the circuit is approximately:

$$A/(1+A \times g_{m1} \times R \times g_{m2})/(1+sRC) \tag{1}$$

The −3 dB high pass corner frequency of the circuit is approximately:

$$g_{m1} \times g_{m2} \times A/(2^{1/2} \times C) \tag{2}$$

The lower +3 dB high pass corner is approximately:

$$1/(R \times C) \tag{3}$$

The floor of the stop band is approximately:

$$1/(g_{m1} \times g_{m2} \times R) \qquad (4)$$

Embodiments of the present invention may be used in any type of circuit that requires DC offset reduction. For example, embodiments of the present invention may be used in wireless and wired receivers. More generally, embodiments of the present invention may used in a variety of wireless technologies such as wireless LAN applications and cellular telephone technologies, and in a variety of hand-held technologies such as personal digital assistants.

Embodiments in accordance with the invention may be implemented in a variety of ways. For example, according to an embodiment of the present invention, the circuit may be implemented as an integrated circuit on a single substrate, as a hybrid device, or as a discrete circuit. The circuit may be implemented on silicon, gallium arsenide or other semiconductor.

The circuits, devices, features and processes described herein are not exclusive of other circuits, devices, features and processes, and variations and additions may be implemented in accordance with the particular objectives to be achieved. For example, circuits as described herein may be integrated with other circuits not described herein to provide further combinations of features, to operate concurrently within the same devices, or to serve other types of purposes. Thus, while the embodiments illustrated in the figures and described above are presently preferred for various reasons as described herein, it should be understood that these embodiments are offered by way of example only. The invention is not limited to a particular embodiment, but extends to various modifications, combinations, and permutations that fall within the scope of the claims and their equivalents.

What is claimed is:

1. An amplifier circuit that provides DC offset reduction, comprising:
    a forward amplifier section that receives an input signal and produces an output signal;
    a linear feedback amplifier section that receives the output signal at its input, stores a charge corresponding to an amount of DC offset in the output signal, generates a feedback signal corresponding to the amount of stored charge, and supplies the feedback signal to the input of the forward amplifier section to cancel DC offset in the output signal; and
    a gain control section that controls the gains of the forward amplifier section and the linear feedback amplifier section, wherein an increase in the gain of the forward amplifier section produces a corresponding decrease in the gain of the linear feedback amplifier section, and a decrease in the gain of the forward amplifier section produces a corresponding increase in the gain of the linear feedback amplifier section.

2. The amplifier circuit claimed in claim 1, wherein the gain control section maintains an approximately constant loop gain through adjustment of the gains of the forward amplifier section and the linear feedback amplifier section.

3. The amplifier circuit claimed in claim 1, wherein the forward amplifier section comprises first and second linear programmable gain amplifiers.

4. The amplifier circuit claimed in claim 1, wherein the linear feedback amplifier section comprises:
    first and second linear programmable gain amplifiers; and
    a storage capacitor provided between the output of the first linear programmable gain amplifier and the input of the second linear programmable gain amplifier.

5. The amplifier circuit claimed in claim 1, further comprising a nonlinear feedback amplifier section that receives the output signal at its input and that provides its output to the storage capacitor.

6. The amplifier circuit claimed in claim 5, wherein the gain of the nonlinear feedback amplifier section increases in proportion to the magnitude of DC offset in the output signal.

7. The amplifier circuit claimed in claim 5, wherein the nonlinear feedback amplifier section is selectively turned on for a period of time corresponding to the magnitude of DC offset in the output signal.

8. The amplifier circuit claimed in claim 5, wherein the nonlinear feedback amplifier section selectively increases a high pass corner frequency of the amplifier circuit in response to the magnitude of DC offset in the output signal.

9. The amplifier circuit claimed in claim 5, wherein the nonlinear feedback amplifier section is comprised of a class A/B amplifier.

10. The amplifier circuit claimed in claim 1, wherein the amplifier circuit receives a differential input signal and produces a differential output signal.

11. The amplifier circuit claimed in claim 1, wherein the amplifier circuit is implemented in a receiver circuit of a wireless communication device.

12. A method for compensating DC offset in a circuit, comprising:
    producing an output signal from an input signal at a forward amplifier section of the circuit;
    storing a charge corresponding to an amount of DC offset in the output signal and generating a feedback signal corresponding to the amount of stored charge in a linear feedback amplifier section;
    supplying the feedback signal to the input of the forward amplifier section to cancel DC offset in the output signal; and
    controlling the gain of the linear feedback amplifier section in a manner corresponding to control of the gain of the forward amplifier section, such that an increase in the gain of the forward amplifier section produces a corresponding decrease in the gain of the linear feedback amplifier section, and a decrease in the gain of the forward amplifier section produces a corresponding increase in the gain of the linear feedback amplifier section.

13. The method claimed in claim 12, wherein the gain of the linear feedback amplifier section and the gain of the forward amplifier section are controlled so as to maintain an approximately constant loop gain.

14. The method claimed in claim 12, wherein storing a charge corresponding to an amount of DC offset in the output signal comprises charging a capacitor by a programmable gain linear amplifier that receives the output signal at its input.

15. The method claimed in claim 12, wherein storing a charge corresponding to an amount of DC offset in the output signal comprises charging the capacitor by a nonlinear amplifier that receives the output signal at its input.

16. The method claimed in claim 15, wherein the gain of the nonlinear feedback amplifier section increases in proportion to the magnitude of DC offset in the output signal.

17. The method claimed in claim 15, wherein the nonlinear feedback amplifier section is selectively turned on for a period of time corresponding to the magnitude of DC offset in the output signal.

18. The method claimed in claim 15, wherein the nonlinear feedback amplifier section selectively increases a high pass corner frequency of the amplifier circuit in response to the magnitude of DC offset in the output signal.

19. The method claimed in claim 15, wherein the nonlinear feedback amplifier section is comprised of a class A/B amplifier.

20. The method claimed in claim 12, wherein the amplifier circuit receives a differential input signal and produces a differential output signal.

* * * * *